US010009985B1

(12) United States Patent
Huang (10) Patent No.: US 10,009,985 B1
(45) Date of Patent: Jun. 26, 2018

(54) LED STRUCTURE WITH WIRELESS POWER DRIVER AND DISPLAY THEREOF

(71) Applicant: Hsien-Jung Huang, New Taipei (TW)

(72) Inventor: Hsien-Jung Huang, New Taipei (TW)

( * ) Notice: Subject to any disclaimer, the term of this patent is extended or adjusted under 35 U.S.C. 154(b) by 0 days. days.

(21) Appl. No.: 15/666,459

(22) Filed: Aug. 1, 2017

(51) Int. Cl.
*H05B 37/02* (2006.01)
*H05B 33/08* (2006.01)
*H02J 50/05* (2016.01)
*H02J 50/10* (2016.01)
*H01L 33/48* (2010.01)
*H01L 33/62* (2010.01)

(52) U.S. Cl.
CPC .......... *H05B 37/0272* (2013.01); *H02J 50/05* (2016.02); *H02J 50/10* (2016.02); *H05B 33/0857* (2013.01); *H01L 33/483* (2013.01); *H01L 33/62* (2013.01)

(58) Field of Classification Search
CPC ............ H05B 37/0227; H05B 37/0272; H05B 33/0857; H05B 33/0881; H02J 50/05; H02J 50/10; H01L 33/62; H01L 33/483

USPC ..... 315/151–153, 185 R, 291, 307, 308, 312
See application file for complete search history.

(56) References Cited

U.S. PATENT DOCUMENTS 9,060,394 B2 * 6/2015 Ando ................. H05B 37/0272
2013/0241432 A1 * 9/2013 Ebihara ............. H05B 37/0272
315/224

* cited by examiner

*Primary Examiner* — Jimmy Vu (57) ABSTRACT

A LED structure with wireless power driver and display thereof is provided. The LED structure receives outside electric and magnetic field to transform into operation power for LED. The LED structure has a driver IC, a receiving element, and a light-emitting element to dispose and pack into a LED carrier directly. The receiving element is utilized to receive the electric and/or magnetic field, and a wireless control signal. The driver IC has a transformation mechanism and a driver mechanism to control the light-emitting element. With the arrangement of the elements to form a high density LED without wired powers. Therefore, the occupied space is reduced and the pins are omitted to save costs.

8 Claims, 12 Drawing Sheets

LED STRUCTURE WITH WIRELESS POWER DRIVER AND DISPLAY THEREOF

BACKGROUND OF THE INVENTION

Field of the Invention

The present invention relates to a LED (Light Emitting Diode) structure, and more particularly, to a LED structure powered by the magnetic and/or electric field to apply in the LED display or light string.

Related Art

The electromagnetic waves, which are synchronized oscillations of electric and magnetic fields that propagate at the speed of light through a vacuum. The oscillations of the two fields are perpendicular to each other and perpendicular to the direction of energy and wave propagation, forming a transverse wave. The electromagnetic spectrum includes, in order of increasing frequency and decreasing wavelength: radio waves, microwaves, infrared radiation, visible light, ultraviolet radiation, X-rays and gamma rays.

However, most of the current energy-used transmission still need to rely on wired systems. Take LED as an example, the power supply of the LED still need to connect to the battery or the transformer structure. The transformer structure is not easy to carry. Because of oxidation or chemical damage, the battery easily causes the environmental pollution. And the size has large difference between the battery and the LED. It is also prone to occur waterproof and replacement problems.

Therefore, concerning about the wired-power issue for LED, it is difficult to achieve compact arrangement to utilize limited-space effectively.

SUMMARY OF THE INVENTION

To solve the aforesaid problems of the prior art, the present invention provides an LED (Light Emitting Diode) structure without any wired power to allow mass production for compact arrangement LEDs with low costs.

Accordingly, the present invention discloses an LED structure with wireless power driver, which has a driver IC, a receiving element, and a light-emitting element to dispose and pack into a LED carrier directly. The receiving element is utilized to receive the electric and/or magnetic field, and a wireless control signal. The driver IC has a transformation mechanism and a driver mechanism to control the light-emitting element. With the arrangement of the elements to form a high density LED without wired powers. Therefore, the occupied space is reduced and the pins are omitted to save costs.

It is another object of this invention to provide an LED display system, which includes a plurality of LEDs above described. Therefore, the LEDs of the display system does not need wired power supply. The LEDs receive the magnetic and/or electric field from the outside source to transform the magnetic and/or electric field into the operation power for LEDs. The display system is controlled by the wireless control signal emitted by a main control terminal.

These and other features, aspects, and advantages of the present invention will become better understood with reference to the following description and appended claims. It is to be understood that both the foregoing general description and the following detailed description are examples, and are intended to provide further explanation of the invention as claimed.

BRIEF DESCRIPTION OF THE DRAWINGS

The present invention will become more fully understood from the detailed description given herein below for illustration only, and thus is not limitative of the present invention, and wherein.

DETAILED DESCRIPTION OF THE INVENTION

Reference will now be made in detail to the present preferred embodiments of the invention, examples of which are illustrated in the accompanying drawings. Wherever possible, the same reference numbers are used in the drawings and the description refers to the same or the like parts.

Figure 1A:
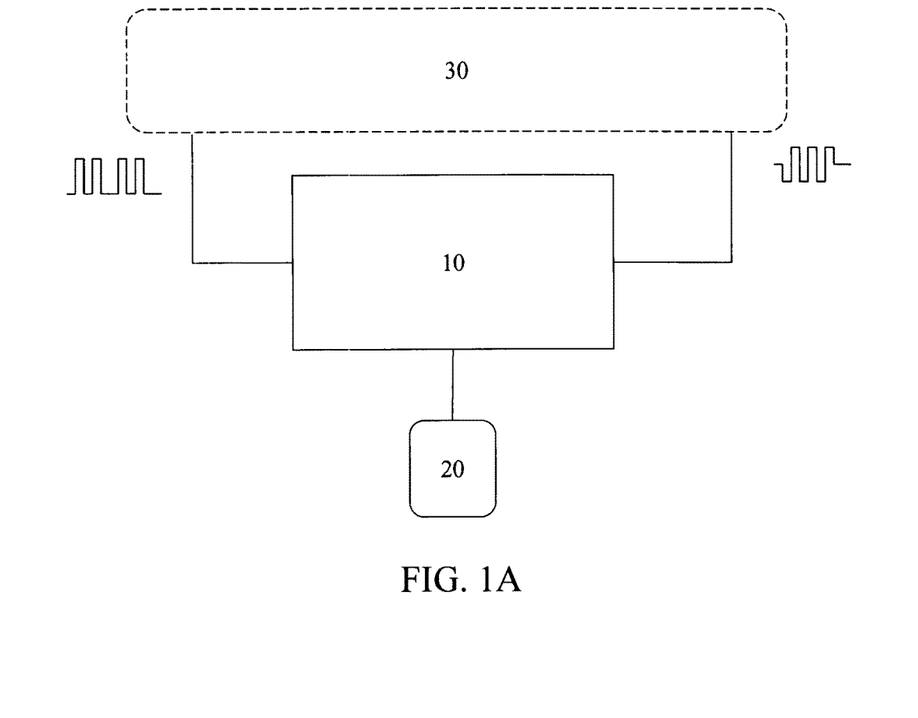
FIG. 1A is a schematic view of a first embodiment of an LED (Light Emitting Diode) structure with wireless power driver according to the present invention.

Please refer to FIG. 1A, which is a schematic view of a first embodiment of an LED (Light Emitting Diode) structure with wireless power driver according to the present invention.

Figure 1B:
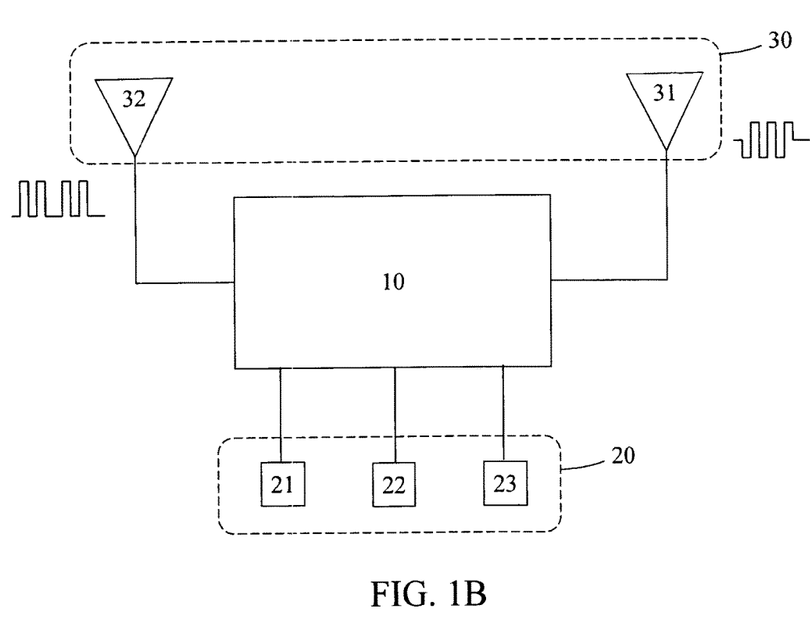
FIG. 1B is a schematic view of a second embodiment of an LED (Light Emitting Diode) structure with wireless power driver according to the present invention.

The LED structure with wireless power driver according to the present invention includes a driver IC 10, a light-emitting element 20, and a receiving element 30. The receiving element 30 is used to receive a magnetic and/or electric field and a wireless control signal, and then transmit to the driver IC 10. The driver IC 10 transform the magnetic and/or electric field into an operation power and generate a controlling signal by processing the wireless control signal, and then transmit to the light-emitting element 20. The light-emitting element 20 will emit light accordingly. The light-emitting element 20 may be LED with any colors. The receiving element 30 includes a first antenna 31 and a second antenna 32 to receive the magnetic and/or electric field and the wireless control signal, respectively. The light-emitting element 20 includes at least one LED dice. As shown, the light-emitting element 20 includes a first LED dice 21, a second LED dice 22 and a third LED dice 23. The previous embodiment is shown in FIG. 1B, which is a schematic view of a second embodiment of an LED structure with wireless power driver according to the present invention.

Figure 2A:
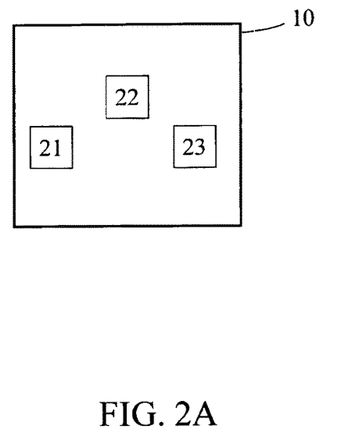
FIG. 2A is a schematic view of a front side of the driver IC of the LED (Light Emitting Diode) structure with wireless power driver according to the present invention.
Figure 2B:
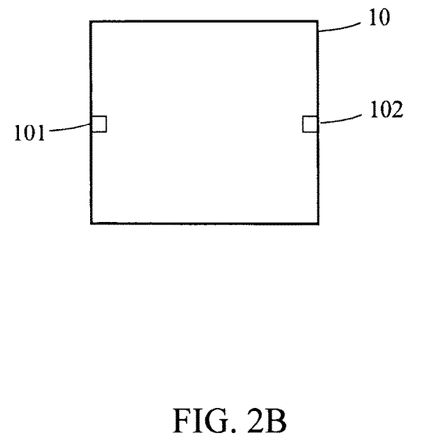
FIG. 2B is a schematic view of a back side of the driver IC of the LED (Light Emitting Diode) structure with wireless power driver according to the present invention.

Please refer to FIG. 2A, which is a schematic view of a front side of the driver IC of the LED (Light Emitting Diode) structure with wireless power driver according to the present invention. Each of the first LED dice 21, the second LED dice 22 and the third LED dice 23 has a first terminal and a second terminal. As shown, the first LED dice 21, the second LED dice 22 and the third LED dice 23 are disposed on the driver IC directly and electrically connected thereon. The back side of the driver IC 10 has a first connector 101 and a second connector 102 to electrically connected to the receiving element 30. Then the glue is implanted to complete the package. Therefore, the number of wires to be bonded is decreased. Please also refer to FIG. 2B, which is a schematic view of a back side of the driver IC of the LED (Light Emitting Diode) structure with wireless power driver according to the present invention.

Figure 3:
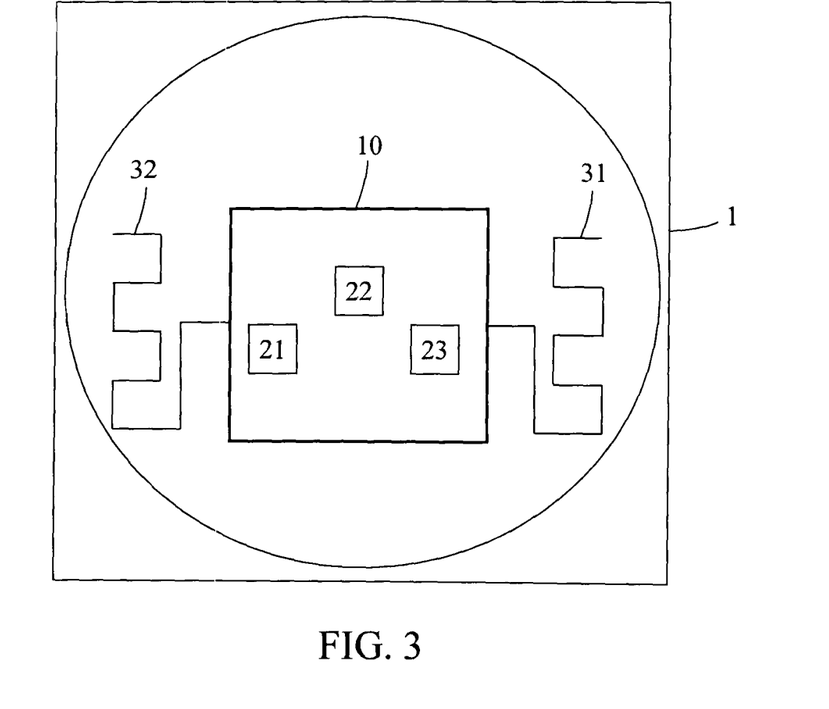
FIG. 3 is a schematic view of a first embodiment of the LED structure according to the present invention.

Then please refer to FIG. 3, which is a schematic view of a first embodiment of the LED structure according to the present invention. The LED structure with wireless power driver according to the present invention does not need any external pins. The LED package 1 includes the driver IC 10, the light-emitting element, and the receiving element disposed in a carrier. The driver IC 10 is disposed in a carrier directly and electrically connected to the receiving element. The receiving element may includes the first antenna 31 and the second antenna 32 which are formed by ITO with tiny volume. The light-emitting element includes at least one LED dice. As shown, the light-emitting element includes the first LED dice 21, the second LED dice 22 and the third LED dice 23, which may be a red LED dice, a green LED dice and a blue LED dice, disposed on and electrically to the driver IC 10 directly. Then the glue is implanted to complete the package.

Figure 4:
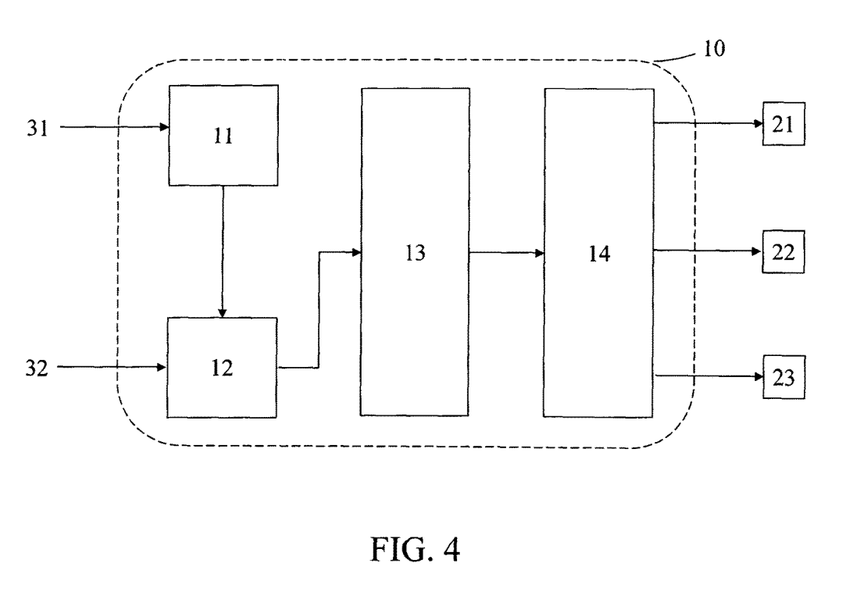
FIG. 4 is a schematic view of the driver IC of the LED (Light Emitting Diode) structure with wireless power driver according to the present invention.

Please refer to FIG. 4, which is a schematic view of the driver IC of the LED (Light Emitting Diode) structure with wireless power driver according to the present invention. The driver IC 10 includes a power transformation element 11, a demodulation element 12, an encoder 13, and a c 14. The power transformation element 11 is connected to the first antenna 31 to transform the magnetic and/or electric field into the operation power. The demodulation element 12 is used to amplify and demodulate the wireless control signal into the controlling signal. The encoder 13 is connected to the demodulation element 12 and used to identify and generate an identification number. The control element 14 is connected to the encoder 13 and used to count and save LED data and transmit the controlling signal to the light-emitting element.

Figure 5:
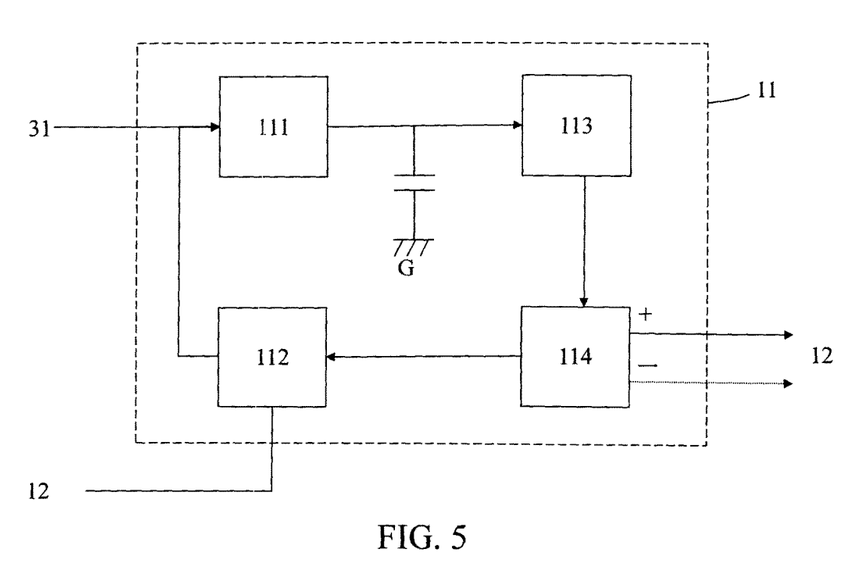
FIG. 5 is a schematic view of the power transformation element of the driver IC of the LED structure with wireless power driver according to the present invention.

Please refer to FIG. 5, which is a schematic view of the power transformation element of the driver IC of the LED structure with wireless power driver according to the present invention. The power transformation element 11 includes an envelope detector 111, a compare circuit 112, a power storage 113, and a regulator circuit 114. The envelope detector 111 is connected to the first antenna 31 and used to detect the magnetic and/or electric field and transform into the operation power. The compare circuit 112 is connected to the envelope detector 111 and used to compare intensity of the magnetic and/or electric field. The power storage 113, may be an electric capacity, is connected to the compare circuit 112 and used to store the operation power. The regulator circuit 114 is connected to the power storage 113 and used to regulate the operation power, so that the operation power does not exceed the margin of error to protect the driver IC and the light-emitting element.

Figure 6:
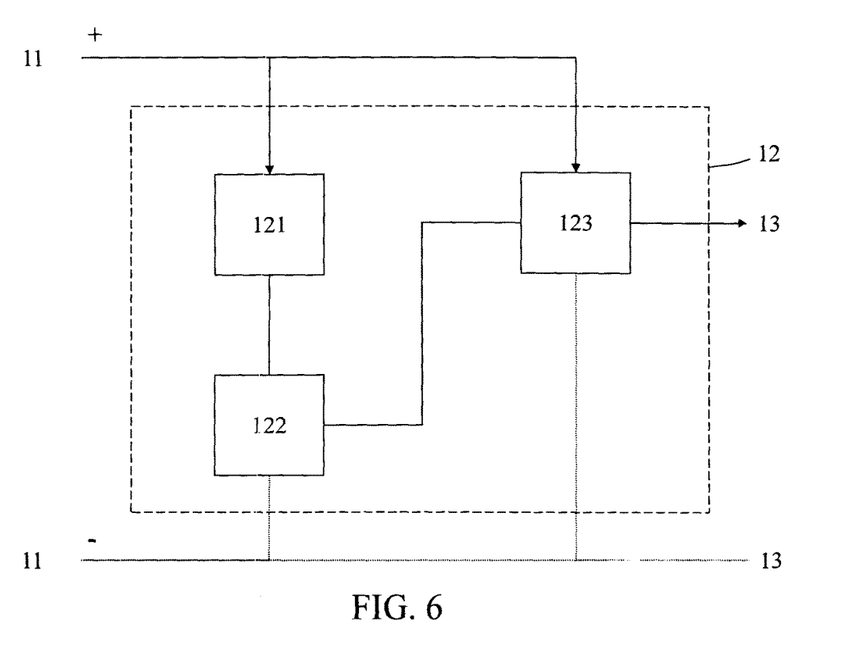
FIG. 6 is a schematic view of the power transformation element of the of the driver IC of the LED structure with wireless power driver according to the present invention.

Please refer to FIG. 6, which is a schematic view of the demodulation element of the driver IC of the LED structure with wireless power driver according to the present invention. The demodulation element 12 includes an oscillator 121, an operational amplifier 122, and a demodulation circuit 123. The oscillator 121 is connected to the power transformation element 11 and used to generate an oscillator frequency for LED operation. The operational amplifier 122 is connected to the oscillator 121 and the second antenna 32, and used to amplify the wireless control signal. The demodulation circuit 123 is connected to the operational amplifier 122 and used to demodulate the wireless control signal into the controlling signal.

Figure 7:
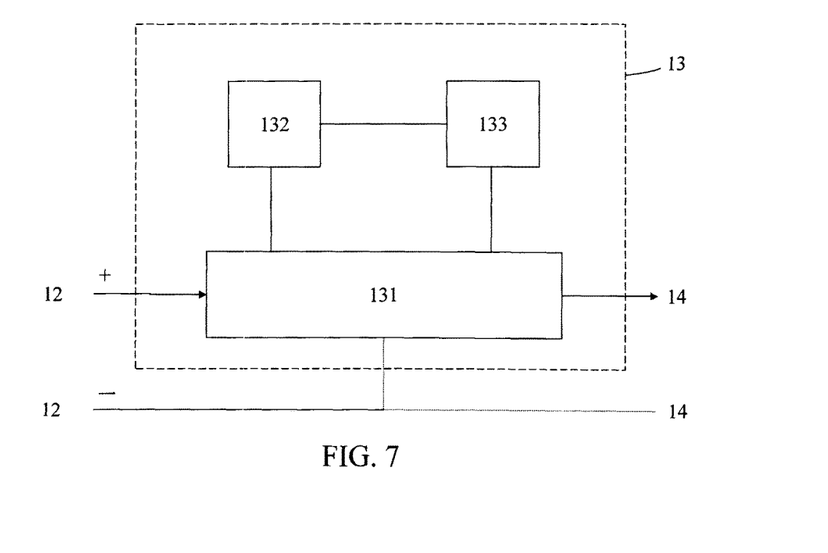
FIG. 7 is a schematic view of the encoder of the of the driver IC of the LED structure with wireless power driver according to the present invention.

Please refer to FIG. 7, which is a schematic view of the encoder of the driver IC of the LED structure with wireless power driver according to the present invention. The encoder 13 includes a logic circuit 131, an identification number generator 132, and a number buffer 133. The logic circuit 131 is connected to the demodulation element 12 and used to identify and control the controlling signal. The identification number generator 132 is connected to the logic circuit 131 and used to generate the identification number for LED. The number buffer 133 is connected to the identification number generator 132 and used to store the identification number and transmit to the logic circuit 131.

Figure 8:
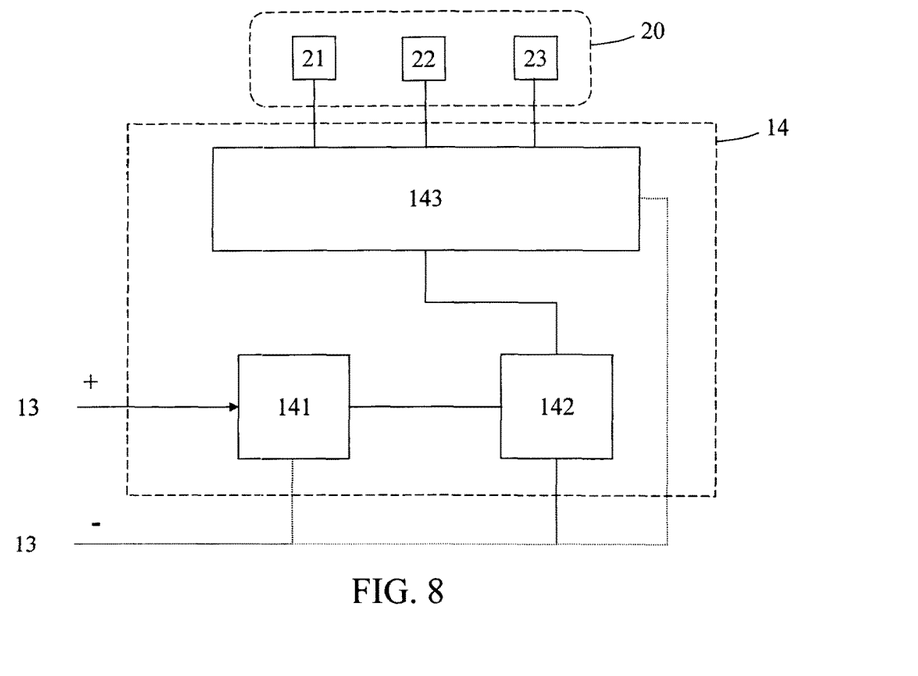
FIG. 8 is a schematic view of the control element of the of the driver IC of the LED structure with wireless power driver according to the present invention.

Please refer to FIG. 8, which is a schematic view of the control element of the driver IC of the LED structure with wireless power driver according to the present invention. The control element 14 includes a count buffer 141, a data buffer 142, and an output buffer 143. The count buffer 141 is connected to the encoder 13 and used to count, shift and store the controlling signal. The data buffer 142 is connected to the count buffer 141 and used to store the data of LED. The output buffer 143 is connected to the data buffer 142 and used to store and transmit the controlling signal to the light-emitting element 20. By controlling currents for the first LED dice 21, the second LED dice 22 and the third LED dice 23 to mix different lights from the red LED dice, the green LED dice and the blue LED dice.

Figure 9:
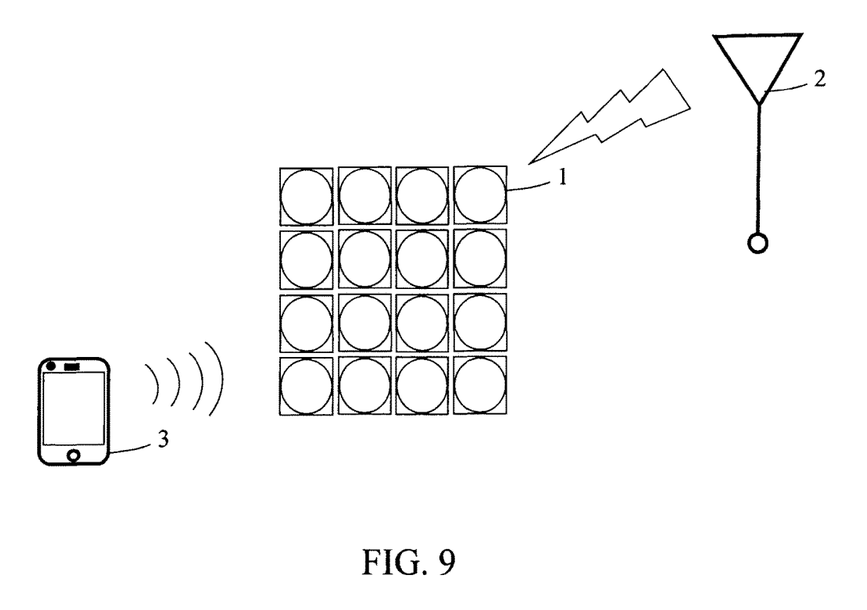
FIG. 9 is a schematic view of a LED display system with wireless power driver according to the present invention.

Please refer to FIG. 9, which is a schematic view of a LED display system with wireless power driver according to the present invention. As shown, the LED display system includes a plurality of LEDs 1 of the present invention as above described. Therefore, the LEDs of the display system does not need wired power supply. The LEDs receive the magnetic and/or electric field from the outside source 2 to transform the magnetic and/or electric field into the operation power for LEDs. The display system may scan and obtain a stronger source. The display system is controlled by the wireless control signal emitted by a main control terminal 3. The main control terminal 3 may be a mobile APP, a front end emitter, or combinations thereof.

Single color control (Red, green, blue, yellow, white and other light sources), brightness light and shade adjustment, color change (fast and slow), color flicker and gradient of the display system may be achieved by the main control terminal 3. Also, it is possible to control the display system by using the pulse width modulation (PWM) mode, and the built-in ID is provided in the driver IC of the LED 1, as above described. Therefore, the control processing of the DMX can be achieved, or each LED is treated as a pixel to achieve the same principle of the screen.

Figure 10A:
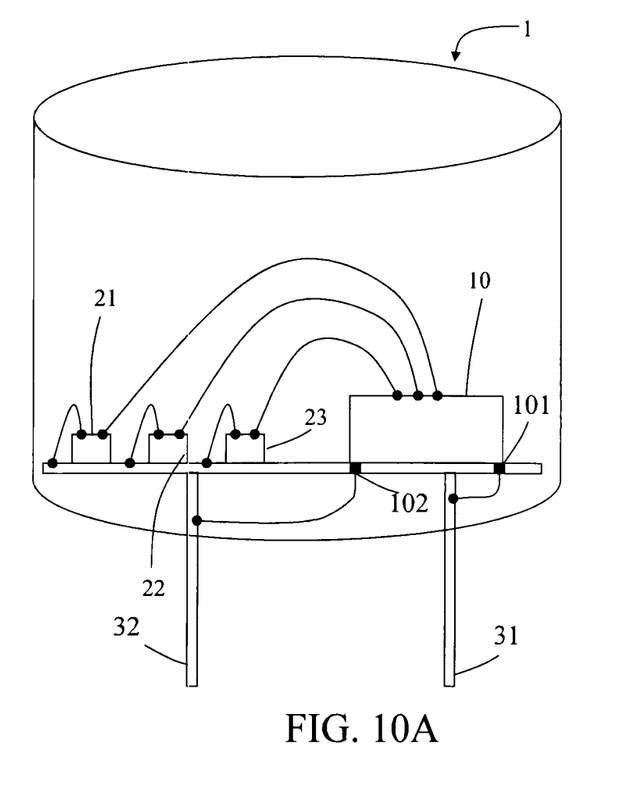
FIG. 10A is a schematic view of a second embodiment of the LED structure according to the present invention.

FIG. 10A is a schematic view of a second embodiment of the LED structure according to the present invention. In this embodiment, the LED is cylinder structure and includes the driver IC 10, the light-emitting element, and the receiving element disposed in a carrier. The driver IC 10 is disposed in a carrier directly and electrically connected to the receiving element. The receiving element may includes the first antenna 31 and the second antenna 32. The light-emitting element includes at least one LED dice. As shown, the light-emitting element includes the first LED dice 21, the second LED dice 22 and the third LED dice 23, which may be a red LED dice, a green LED dice and a blue LED dice, disposed in the carrier and electrically to the driver IC 10. Then the glue is implanted to complete the package. The first antenna 31 and the second antenna 32 are disposed beyond the cylinder structure to serve as braces to support the LED structure. The first antenna 31 and the second antenna 32 are electrically connected to the first connector 101 and the second connector 102 of the driver IC 10 and used to receive the signal.

Figure 10B:
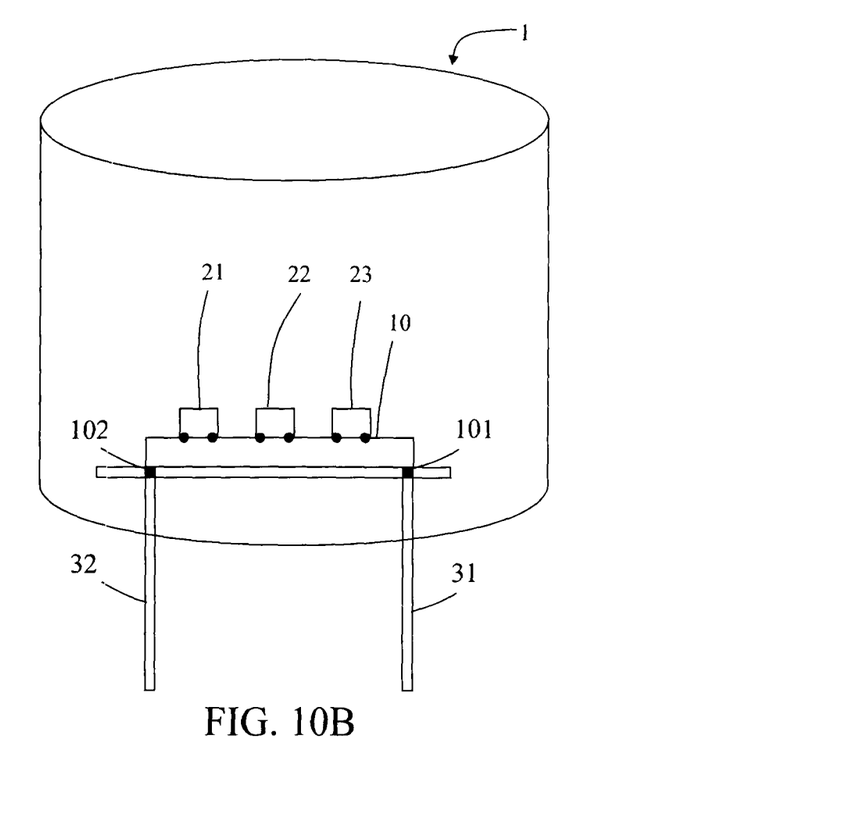
FIG. 10B is a schematic view of a third embodiment of the LED structure according to the present invention.

FIG. 10B is a schematic view of a third embodiment of the LED structure according to the present invention. In this embodiment, the LED is cylinder structure and includes the driver IC 10, the light-emitting element, and the receiving element disposed in a carrier. The driver IC 10 is disposed in a carrier directly and electrically connected to the receiving element. The receiving element may includes the first antenna 31 and the second antenna 32. The light-emitting element includes at least one LED dice. As shown, the light-emitting element includes the first LED dice 21, the second LED dice 22 and the third LED dice 23, which may be a red LED dice, a green LED dice and a blue LED dice, disposed on and electrically to the driver IC 10 directly. Then the glue is implanted to complete the package. The first antenna 31 and the second antenna 32 are disposed beyond the cylinder structure to serve as braces to support the LED structure. The first antenna 31 and the second antenna 32 are electrically connected to the first connector 101 and the second connector 102 of the driver IC 10 and used to receive the signal.

Accordingly, the LED package structure may be connected together, either in parallel or in serial, to form a larger LED display or light string. Each of the LEDs has built-in ID and is controlled wirelessly. The control signal includes serial data to control red, green, and blue dices. The oscillator frequency is generated by the driver IC and the LED dice is controlled by Pulse Width Modulation mode. Therefore, it is easy to form a large-scale display screen by disposing LEDs without concern about the wire layout Furthermore, the LED structure of this invention does not need external pins. Hence, the intervals between the adjacent full-color LEDs so that the distance in-between is effectively shortened and a large-scale display screen may display finer images.

Moreover, the type of the LED structure maybe sphere, ellipsoid, cylinder or square. The LED may be SMD type and may be full-color or single color. The wireless control signal may be transmission via WIFI or bluetooth. The frequency of the magnetic and electric field may be 900M, 1800M, or 2.4G Hz, but not limited.

Additional advantages and modifications will readily occur to those proficient in the relevant fields. The invention in its broader aspects is therefore not limited to the specific details and representative embodiments shown and described herein. Accordingly, various modifications may be made without departing from the spirit or scope of the general inventive concept as defined by the appended claims and their equivalents.

What is claimed is:

1. A LED (Light Emitting Diode) structure with wireless power driver, comprising:
   a receiving element, adapted to receive a magnetic and/or electric field and a wireless control signal;
   a driver IC, connected to the receiving element and adapted to transform the magnetic and/or electric field into an operation power and generate a controlling signal by processing the wireless control signal; and
   a light-emitting element, adapted to receive the operation power and the controlling signal to emit light accordingly;
   wherein the receiving element includes a first antenna and a second antenna to receive the magnetic and/or electric field and the wireless control signal, respectively.

2. The LED package structure of claim 1, wherein the light-emitting element includes a red LED dice, a green LED dice and a blue LED dice.

3. The LED package structure of claim 1, wherein the driver IC comprising:
   a power transformation element, adapted to transform the magnetic and/or electric field into the operation power;
   a demodulation element, connected to the power transformation element and adapted to amplify and demodulate the wireless control signal into the controlling signal;
   an encoder, connected to the demodulation element and adapted to identify and generate an identification number; and
   a control element, connected to the encoder and adapted to count and save data and transmit the controlling signal to the light-emitting element.

4. The LED package structure of claim 3, wherein the power transformation element comprising:
   an envelope detector, connected to the receiving element and adapted to detect the magnetic and/or electric field and transform into the operation power;
   a compare circuit, connected to the envelope detector and adapted to compare intensity of the magnetic and/or electric field;
   a power storage, connected to the compare circuit and adapted to store the operation power; and
   a regulator circuit, connected to the power storage and adapted to regulate the operation power.

5. The LED package structure of claim 3, wherein the demodulation element comprising:
   an oscillator, connected to the power transformation element and adapted to generate an oscillator frequency;
   an operational amplifier, connected to the oscillator and the receiving element, and adapted to amplify the wireless control signal; and
   a demodulation circuit, connected to the operational amplifier and adapted to demodulate the wireless control signal into the controlling signal.

6. The LED package structure of claim 3, wherein the encoder comprising:
   a logic circuit, connected to the demodulation element and adapted to identify and control the controlling signal;
   an identification number generator, connected to the logic circuit and adapted to generate the identification number; and a number buffer, connected to the identification number generator and adapted to store the identification number and transmit to the logic circuit.

7. The LED package structure of claim 3, wherein the control element comprising:
a count buffer, connected to the encoder and adapted to count, shift and store the controlling signal;
a data buffer, connected to the count buffer and adapted to store the data; and
an output buffer, connected to the data buffer and adapted to store and transmit the controlling signal to the light-emitting element.

8. The LED package structure of claim 1, wherein the wireless control signal is a pulse width modulation (PWM) signal.

* * * * *